(12) United States Patent
Zebhauser et al.

(10) Patent No.: US 11,929,566 B2
(45) Date of Patent: Mar. 12, 2024

(54) CIRCUIT BOARD CONNECTOR ASSEMBLY

(71) Applicant: Rosenberger Hochfrequenztechnik Gmbh & Co. KG, Fridolfing (DE)

(72) Inventors: Martin Zebhauser, Laufen (DE); Stefan Löffelholz, Lorsch (DE); Georg Christoph Lochner, Tittmoning (DE)

(73) Assignee: ROSENBERGER HOCHFREQUENZTECHNIK GMBH & CO. KG, Fridofing (DE)

( * ) Notice: Subject to any disclaimer, the term of this patent is extended or adjusted under 35 U.S.C. 154(b) by 253 days.

(21) Appl. No.: 17/562,088

(22) Filed: Dec. 27, 2021

(65) Prior Publication Data
US 2022/0216631 A1 Jul. 7, 2022

(30) Foreign Application Priority Data
Jan. 1, 2021 (EP) .................................. 21150002

(51) Int. Cl.
*H01R 12/72* (2011.01)
*H01R 13/502* (2006.01)
*H05K 3/32* (2006.01)

(52) U.S. Cl.
CPC ......... *H01R 12/721* (2013.01); *H01R 13/502* (2013.01); *H05K 3/32* (2013.01); *H05K 2203/159* (2013.01)

(58) Field of Classification Search
CPC ............................ H01R 12/721; H01R 13/502
USPC ......................................................... 439/626
See application file for complete search history.

(56) References Cited

U.S. PATENT DOCUMENTS

| | | | | |
|---|---|---|---|---|
| 6,863,545 | B2 * | 3/2005 | Peloza | H01R 12/7005 439/931 |
| 7,255,601 | B2 * | 8/2007 | Harper, Jr. | H01R 43/0263 439/607.07 |
| 9,246,250 | B2 * | 1/2016 | Yoshiura | H01R 13/502 |
| 2004/0198082 | A1 * | 10/2004 | Zaderej | H01R 43/0263 439/83 |
| 2006/0134944 | A1 | 6/2006 | Harper, Jr. | |
| 2008/0070443 | A1 * | 3/2008 | Harper, Jr. | H01R 13/502 439/607.05 |

(Continued)

FOREIGN PATENT DOCUMENTS

| | | | |
|---|---|---|---|
| CN | 105281088 A | * | 1/2016 |
| CN | 209981524 U | * | 1/2020 |
| CN | 209981524 U | | 1/2020 |

(Continued)

OTHER PUBLICATIONS

Machine Translation of CN209981524U.
Machine Translation of JP2015076340A.

*Primary Examiner* — Peter G Leigh
(74) *Attorney, Agent, or Firm* — David P. Dickerson

(57) ABSTRACT

An assembly, comprising: a circuit board; a electrical connector mounted to a circuit board; and a counterweight mounted to the circuit board, wherein the counterweight contacts a first major surface of the circuit board, a center of gravity of the electrical connector is not situated in a plane that perpendicularly intersects the first major surface, a combined center of gravity of the electrical connector and the counterweight is situated in a plane that perpendicularly intersects the first major surface, the counterweight arches over an outer circumference of the electrical connector.

20 Claims, 2 Drawing Sheets

(56) References Cited

U.S. PATENT DOCUMENTS

2015/0140858 A1\* 5/2015 Yoshiura .............. H01R 13/502
439/567

FOREIGN PATENT DOCUMENTS

DE 102012213076 A1 1/2014
JP 2015076340 A 4/2015

\* cited by examiner

CIRCUIT BOARD CONNECTOR ASSEMBLY

FIELD OF THE INVENTION

The present disclosure relates to a circuit board arrangement.

TECHNICAL BACKGROUND

In the context of preassembling, it is known for connectors to be fixed on printed circuit boards so as to secure a connector in relation to tilting on the printed circuit board. This results in an additional complexity in terms of assembly or in a requirement in terms of additional installation space for envisaged fixing means, respectively.

This is a state of affairs that is to be improved.

SUMMARY OF THE INVENTION

The present disclosure teaches a printed circuit board arrangement having a printed circuit board, a printed circuit board connector which is preassembled or assembled on the printed circuit board, and having a weight which is attached at least to the printed circuit board connector, wherein the printed circuit board connector per se in an assembled position has a center of gravity which is projected into the printed circuit board plane and is situated outside the printed circuit board, and wherein a composite of the printed circuit board connector and the weight in an assembled position has a center of gravity which is projected into the printed circuit board plane and from the printed circuit board has a smaller spacing or no spacing, said spacing being less than that of the projected center of gravity of the printed circuit board connector.

The present disclosure recognizes that printed circuit board connectors which are to be assembled on a printed circuit board often have an unfavorable center of gravity in terms of the position of the printed circuit board. Tilting of the printed circuit board connector in relation to the printed circuit board thus arises when a center of gravity of the printed circuit board connector that is projected into the printed circuit board plane is situated outside the printed circuit board.

The printed circuit board plane is that plane that is defined by the printed circuit board, or the plane that contains the surface of a printed circuit board, respectively.

The preassembled state means that the connector arrangement is only partially assembled. It can be provided, for example, that components in a preassembled state are releasably stuck to one another but not yet finally fastened to one another. The final assembled state means that the assembly of the connector arrangement is completed and the connector arrangement is ready for use.

The center of gravity and the projected center of gravity have to be differentiated in this pate-It application. The center of gravity of a body is the weighted mean value of the positions of the mass point geometry thereof. The center of gravity of objects that are assembled on a printed circuit board is typically above the printed circuit board. A projected center of gravity is derived from a vertical projection of the center of gravity into the printed circuit board plane, wherein the straight line between the center of gravity and the projected center of gravity is orthogonal to the printed circuit board plane.

The tilting of the printed circuit board connector in relation to the printed circuit board often leads to damage to the electric terminals of the printed circuit board connector and/or of the printed circuit board.

The present disclosure teaches a repositioning of the projected center of gravity of the printed circuit board connector towards the printed circuit board such that tilting of the printed circuit board connector in relation to the printed circuit board prior to the printed circuit board connector being fastened to the printed circuit board is prevented.

The present disclosure teaches that the printed circuit board connector for repositioning the center of gravity is connected to a weight before the printed circuit board connector is preassembled the printed circuit board, or before the electric terminals of the connector contacts electric terminals of the printed circuit board, respectively. A printed circuit board connector to which a weight is fastened is also referred to as a composite hereunder.

It is understood the center of gravity of the composite of the weight and the printed circuit board connector that is projected into the printed circuit board plane is preferably disposed so as to be as close as possible to the printed circuit board, or within the latter, and that the weight by means of which the projected center of gravity is repositioned, can be configured so as to be as small and compact as possible, on the other hand.

In order for this compromise to be implemented in practice, it can also be advantageous to take into account adhesive forces and/or frictional forces between the composite and the printed circuit board. This means that a projected center of gravity does not inevitably have to lie within the printed circuit board in order to prevent tilting of the composite of the weight and the printed circuit board connector in relation to the printed circuit board if the adhesive forces and frictional forces between the composite and the printed circuit board, also in a preassembled state, are sufficiently high.

The position of the projected center of gravity of a printed circuit board connector preassembled on a printed circuit board in relation to the printed circuit board can be determined or estimated, respectively, by calculation, simulation or by experiments. The same applies in an analogous manner to the composite of the printed circuit board connector and the weight.

Advantageous design embodiments and refinements are derived from the further dependent claims as well as from the description with reference to the figures of the drawing.

According to some embodiments, the weight contacts the printed circuit board. It can be provided here that the weight is fastened to the printed circuit board. For example, adhesive connections, press-fit connections and the like can be considered as fastening means. This guarantees that the composite of the weight and the printed circuit board connector is sufficiently stabilized in relation to the printed circuit board.

According to some embodiments, the weight is supported by the printed circuit board in such a manner that a gap exists between the printed circuit board and the printed circuit board connector.

It is thus possible to preclude canting of the printed circuit board connector in relation to the printed circuit board, for example by virtue of manufacturing tolerances.

It is understood that the gap between the printed circuit board and the print circuit board connector may be partially configured, meaning that it may be sufficient for a gap to exist in a sub-region of a printed circuit board connector, between the printed circuit board connector and the printed circuit board. It is furthermore understood that the gap does not compromise the contact between electric terminals of the printed circuit board and the printed circuit board connector, i.e, that the gap does not extend to the electric terminals.

According to some embodiments, the weight has a coding, means for predefining one or a plurality of assembly positions and/or orientations of the printed circuit board connector on the printed circuit board. A faulty assembly of the printed circuit board connector can thus be prevented when the coding, means are configured in such a manner that a laterally transposed assembly of the printed circuit board connector on the printed circuit board is prevented.

According to some embodiments, the weight guarantees only passive electrical functionalities or no electrical functionality of the printed circuit board arrangement. The modularity of the weight is thus guaranteed, meaning that the use of the weight is not mandatory if difficulties in the assembly can also be otherwise alleviated.

Passive electrical properties include all electrical properties inherent to electrically conducting components; for example, an electrically conducting weight may improve the electromagnetic shielding of a composite of the weight and the printed circuit board connector.

All influences of the weight on the electrical properties of the connector, such as the shielding or the impedance of the latter, are referred to as passive properties unless the latter have to be actively controlled and the latter are the result of the material, the structure and the like of said connector.

According to some embodiments, mutually contacting components of the printed circuit board connector and of the weight are produced by means of different manufacturing methods. It can be provided here that a component of the printed circuit board connector that contacts the weight is produced by means of a stamping-and-bending method, and the weight is produced by means of a casting method, for example by means of a die casting method.

For example, it often arises that it is advantageous for an outer conductor of a printed circuit board connector to be produced by means of a stamping-and-bending method because a large band width of geometries can thus be produced in a cost-effective manner. However, it may prove disadvantageous to process the workpieces with a great mass by means of a stamping-and bending method. For example, in practice it often proves to be advantageous to produce objects with a high weight by means of a casting method.

According to some embodiments, the printed circuit board connector is irreversibly connected to the weight. Irreversibly connected means that a connection between two objects cannot be released in an non-destructive manner, or without damage, respectively, unless a connection is specifically provided for destruction, and/or the components to be connected have been deformed in the context of the connecting process.

Materially integral connections such as, for example, soldering or adhesive bonding, form-fitting connections, force-fitting connections, for example bracing, may be considered as irreversible connections. It is in particular conceivable that the weight is fastened to the printed circuit board connector by means of a penetrating joining process, for example by clinching. Durable latching or snap-fit connections are also possible with a view to an irreversible connection between the printed circuit board connector and the weight.

Alternatively, it is also conceivable for the weight to be releasably fastened to the printed circuit board connector. It can also be provided here that the weight is removed from the printed circuit board connector once the assembly of the printed circuit board connector on the printed circuit board has been completed.

For example, it is conceivable for the weight to be magnetically fastened to the printed circuit board connector by means of easily destructible latching connections or by means of clip connections of insufficient permanence. It is decisive that the printed circuit board connector is not damaged when a reversible connection between a printed circuit board connector and a weight is destroyed.

It is understood that connections between a printed circuit board connector and a weight may be specifically configured for temporary fastening and for easy destruction once the assembly process has been completed. To the extent that only the connection but not the printed circuit board connector is damaged by releasing such easily destructible connections of this type, reference is nevertheless made to a reversible connection.

According to some embodiments, the weight bears on at least two bearing faces and/or on at least two contact faces on the printed circuit board, wherein the bearing faces and/or the contact faces can be disposed so as to be symmetrical in relation to a symmetry axis of the printed circuit board connector. Modular properties of the weight that guarantee a high degree of flexibility for various combinations of a printed circuit board and a printed circuit board connector are thus possible in that the bearing faces, or contact faces, respectively, are sized and disposed as a function of the position of the printed circuit board in relation to the printed circuit board connector.

It is understood that a weight for assembly in a printed circuit board arrangement as described above is advantageous.

It is furthermore understood that a set of a printed circuit board connector and a weight is also advantageous when the printed circuit board connector and the weight are specified for being assembled on one another so as to form a composite in the context of preassembling, so as to upon final assembly of the composite of the weight and the printed circuit board connector to be assembled on a printed circuit board during final assembly, so as to form a printed circuit board arrangement as has been described above.

It is understood that an assembly method for such a set is also advantageous when said assembly method comprises the following steps: providing a printed circuit board connector and a weight; fastening the weight to the printed circuit board connector, in particular by means of clinching, so as to obtain a composite of a printed circuit board connector and a weight.

It is also advantageous here when a printed circuit board arrangement is assembled in that a composite as described above is provided and the composite is assembled on the printed circuit board in such a manner that a current path runs from the printed circuit board into the printed circuit board connector, wherein the position of the center of gravity of the composite of weight and printed circuit board connector lies in such a manner that tilting of the composite while assembling the composite on the printed circuit board is prevented.

It is understood that the features mentioned above and yet to be explained hereunder can be used not only in the respective stated combination but also in other combinations, or individually, without departing from the scope of the present invention.

The above design embodiments and refinements can be combined with one another in an arbitrary manner should this be expedient. Further potential design embodiments, refinements and implementations of the invention comprise also combinations, not explicitly mentioned, of features of the invention that are described above or hereunder in terms of the exemplary embodiments. The person skilled in the art here will, in particular, also add individual aspects as improvements or additions to the respective basic form of the present invention.

BRIEF DESCRIPTION OF THE DRAWING

The present invention will be explained in more detail hereunder by means of the exemplary embodiments stated in the schematic figures of the drawing in which.

Figure 1:
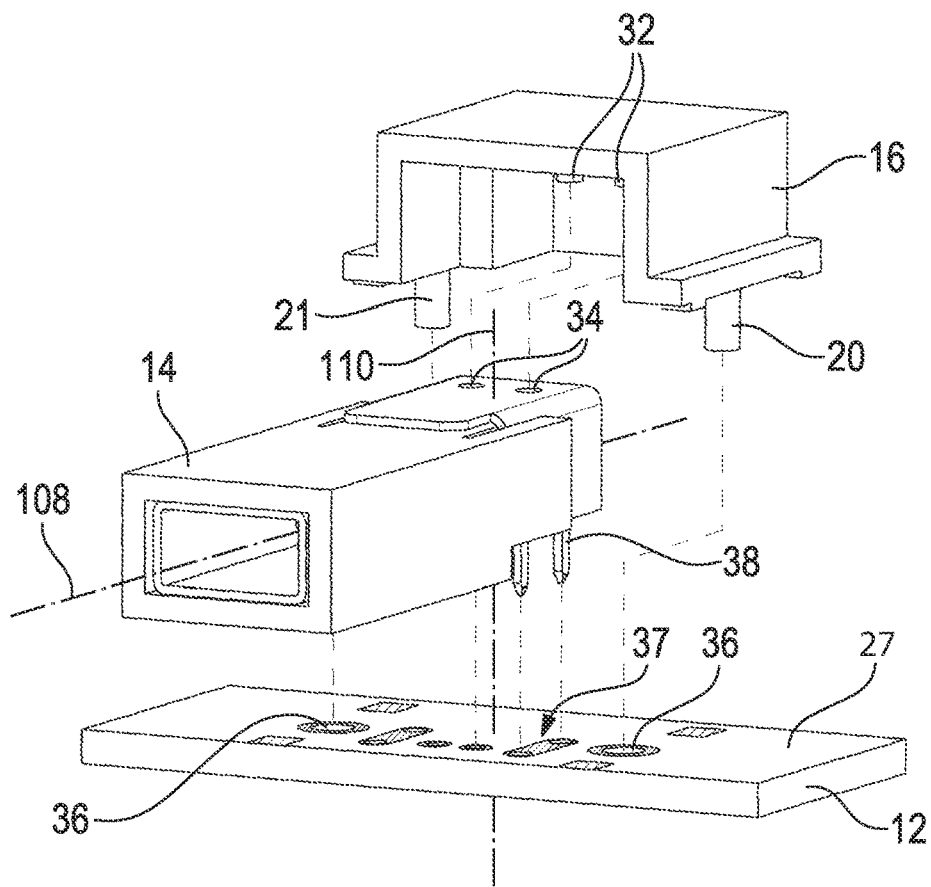
FIG. 1 shows a schematic exploded view of a printed circuit board arrangement in accordance with the teaching of the present disclosure.

The appended figures of the drawing are intended to offer an improved understanding of the embodiments of the invention. Said figures visualize exemplary embodiments and in conjunction with the description serve in explaining principles and concepts of the invention. Other embodiments and many of the advantages mentioned are derived with a view to the drawings. The elements of the drawings are not necessarily shown true to scale.

Identical and functionally equivalent elements, features and components, and those of equivalent action, are in each case provided with the same reference signs in the figures unless otherwise stated.

The figures hereunder are described in conjunction and combination with one another.

DESCRIPTION OF EXEMPLARY EMBODIMENTS

FIG. 1 shows a printed circuit arrangement 10 in an exploded view. The printed circuit arrangement 10 comprises a printed circuit board 12, a printed circuit board connector 14 and a weight 16. Printed circuit board 12 has a major surface 27. Weight 16 may be termed a counter-weight. Weight 16 has a first side wall 46, a second side wall 47, an upper wall 48 and a rear wall 49 (shown in FIG. 3). As shown in FIG. 1 as well as in FIGS. 2 and 3, first side wall 46, second side wall 47, and upper wall 48 collectively form an arch-like structure that may be at least partially closed on one side by rear wall 49, e.g. as shown in FIG. 1.

The position in which the printed circuit board connector 14 and the weight 16 are assembled in relation to the printed circuit board 12 is derived from FIG. 1. The printed circuit board connector 14 and the weight 16 have in each case connecting means for fastening the weight 16 to the printed circuit board connector 14. To this end, the weight 16 has pins 32 which are pressed into bores 34 of the printed circuit board connector 14. As such, bores 34 may constitute engagement structures to which pins 32 constitute counterpart engagement structures. Furthermore, the weight 16 has pins that are configured as coding means 20, 21 and pressed into bores 36 in the printed circuit board 12. The printed circuit board connector 14 has a pair of electric terminals 38 which are inserted in bores 37 of the printed circuit board 12 and electrically contact a conductor path in the interior of the printed circuit board. Bores 36 and 37 may be termed mounting holes.

It can be seen in FIG. 1 that the printed circuit board connector 14 per se in relation to the printed circuit board 12 has an unfavorable center of gravity when the printed circuit board connector 14 is assembled on the printed circuit board 12, thus that a center of gravity of the printed circuit board connector 14 that is projected into a printed circuit board plane is situated significantly outside the printed circuit board 12.

In order to prevent tilting of the printed circuit board connector 14 on the printed circuit board, the weight 16 is fastened to the printed circuit board connector 14 before the printed circuit board connector 14 is assembled on the printed circuit board 12. It can be provided here that the weight 16 has a higher density than the printed circuit board connector 14 so as to displace to a sufficient extent the center of gravity of the composite of the weight 16 and the printed circuit board connector 14 in relation to the center of gravity of the printed circuit board connector 14.

Figure 2:
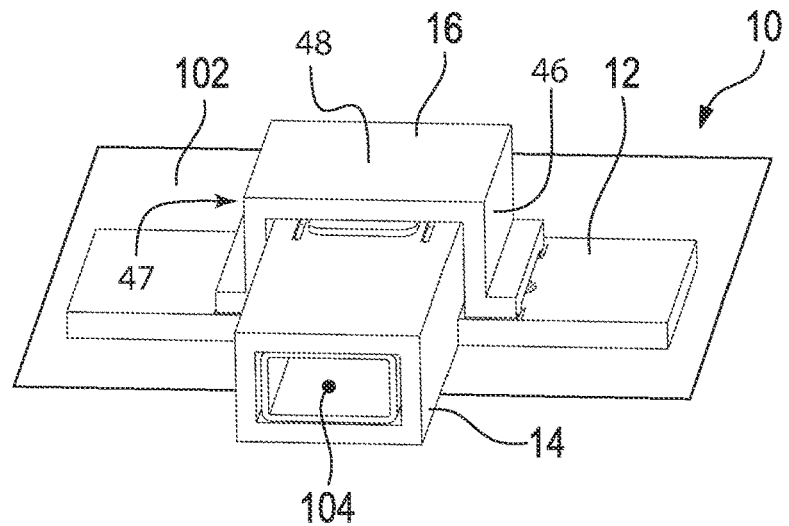
FIG. 2 shows a schematic perspective view of a printed circuit board arrangement in accordance with the teaching of the present disclosure.

FIG. 2 shows a perspective view of a printed circuit board arrangement having a printed circuit board 12, a printed circuit board connector 14 and a weight 16. The projected center of gravity 106 of the composite 11 is situated within the printed circuit board 12, whereas the projected center of gravity 104 of the printed circuit board connector 14 is situated significantly outside the printed circuit board 12. As depicted in FIG. 2, weight 16 arches over connector 14. More particularly, weight 16 arches over an outer circumference of connector 14. In some embodiments, at least 50%, at least 70% or at least 80% of weight 16 by weight may be situated exterior of connector 14. As depicted in FIG. 2, an entirety of weight 16 may be situated exterior of connector 14.

Figure 3:
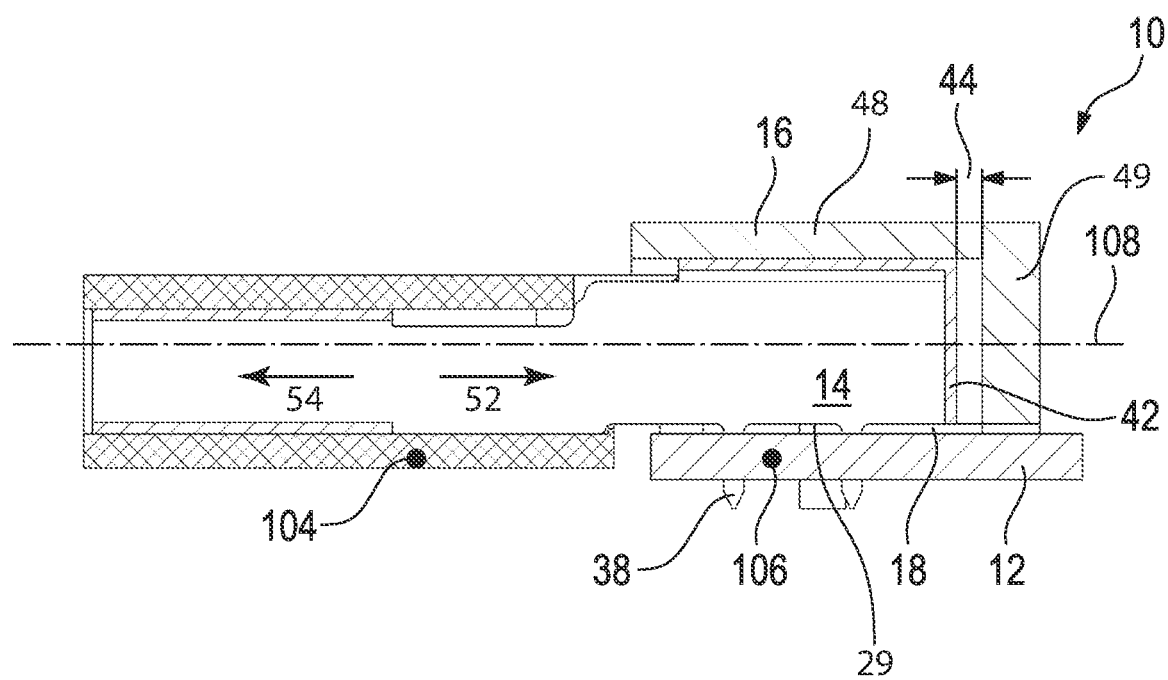
FIG. 3 shows a schematic sectional view of a printed circuit board arrangement in accordance with the teaching of the present disclosure.

FIG. 3 shows a schematic longitudinal sectional view of a printed circuit arrangement 10. The position of the projected center of gravity 104 of the printed circuit board connector 14 and of the projected center of gravity 106 of the composite 11 can be seen in FIG. 3. It can furthermore be seen that a partial gap 18 exists between the printed circuit board 12 and the printed circuit board connector 14. With the exception of the electric terminals 38, the gap 18 extends across the entire region between the printed circuit board connector 14 and the printed circuit board 12. As depicted in FIG. 3, printed circuit board connector 14 has a (lower) major surface 29 that adjacently faces (upper) major surface 27 of printed circuit board 12. Major surface 29 is separated from printed circuit board 12 by gap 18 and thus does not abut (upper) major surface 27 of printed circuit board 12.

Furthermore, a lateral end 42 of the printed circuit board connector 14 is also spaced apart from an opposite edge of the weight 16. In other words, as shown, rear wall 49 of weight 16 is separated from printed circuit board connector 14 by a spacing 44, which spacing 44 may be termed a gap. This spacing 44 has the effect of an increased repositioning of the projected center of gravity 106 in relation to the projected center of gravity 104, because the lever that acts from the weight on the printed circuit board connector is increased as a result.

It is understood that a spacing 44 of this type can be sized as a function of a required displacement of the projected center of gravity 106 in relation to the projected center of gravity 104, and as a function of an available installation space.

Figure 4:
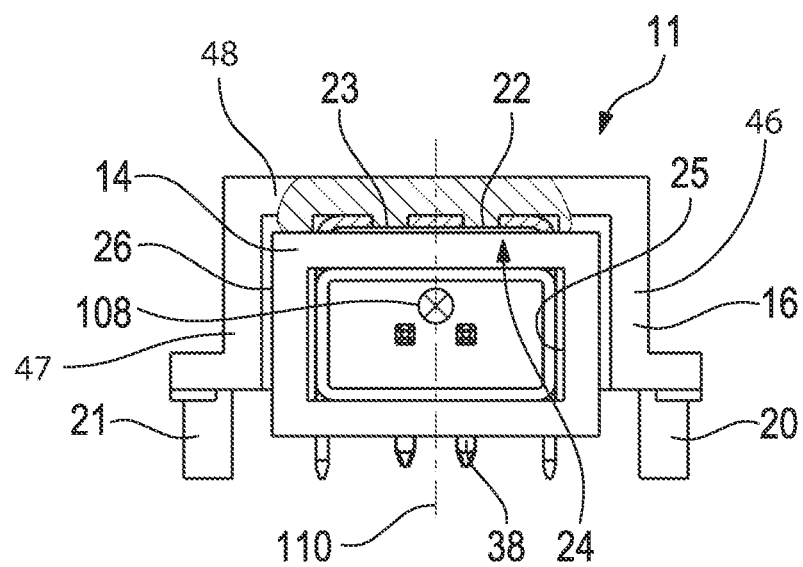
FIG. 4 shows a schematic sectional view of a composite in accordance with the teaching of the present disclosure.

FIG. 4 shows a cross-sectional view of a composite 11 of a printed circuit board connector 14 and a weight 16. Illustrated in FIG. 4 are a horizontal symmetry axis 110 and a longitudinal symmetry axis 108. The printed circuit board connector 14 is fastened to bearing faces 22, 23 and contact faces 25, 26 of the weight that contact the printed circuit board connector on the surface 24 thereof. The bearing faces and contact faces 22, 23, 25, 26 are disposed so as to be symmetrical in relation to the symmetry axes 108 and 110.

While the present invention has been completely described above by means of preferred exemplary embodiments, the present invention is not limited thereto but may be modified in many ways.

The present disclosure may be summarized as disclosing, inter alia, the following Embodiments.

Embodiment 1

Printed circuit board arrangement (10)
having a printed circuit board (12), a printed circuit board connector (14) which is preassembled or assembled on the printed circuit board, and having a weight (16) which is attached at least to the printed circuit board connector (14),
wherein the printed circuit board connector (14) per se in terms of the printed circuit board has a center of gravity (104) which is projected into the printed circuit board plane (102) and is situated outside the printed circuit board (12), and
wherein a composite (11) of the printed circuit board connector (14) and the weight (16) has a center of gravity (106) which is projected into the printed circuit board plane (102) and from the printed circuit board (12) has a smaller spacing or no spacing, said spacing being less than that of the projected center of gravity (104) of the printed circuit board connector (14).

Embodiment 2

Printed circuit board arrangement according to Embodiment 1,
wherein the weight (16) contacts the printed circuit board (12) and is in particular fastened to the printed circuit board (12).

Embodiment 3

Printed circuit board arrangement according to Embodiment 1 or 2,
wherein the weight (16) is supported by the printed circuit board (12) in such a manner that a gap (18) exists between the printed circuit board (12) and the printed circuit board connector (14).

Embodiment 4

Printed circuit board arrangement according to any one of Embodiments 1-3,
wherein the weight (16) has a coding means (20, 21) for predefining one or a plurality of assembly positions and/or orientations of the printed circuit board connector (14) on the printed circuit board (12).

Embodiment 5

Printed circuit board arrangement according to any one of Embodiments 1-4,
wherein the weight (16) guarantees only passive electrical functionalities or no electrical functionality of the printed circuit board arrangement (10).

Embodiment 6

Printed circuit board arrangement according to any one of Embodiments 1-5,
wherein mutually contacting, components (22-26) of the printed circuit board connector and of the weight are produced by means of different manufacturing, methods, wherein in particular a component of the printed circuit board connector (14) that contacts the weight is produced by means of a stamping-and-bending method, and the weight (16) is produced by means of a casting method.

Embodiment 7

Printed circuit board arrangement according to any one of Embodiments 1-6,
wherein the printed circuit board connector (14) is irreversibly connected to the weight (16).

Embodiment 8

Printed circuit board arrangement according to any one of Embodiments 1-7,
wherein the weight (16) has at least two bearing faces (22, 23) and/or at least two contact faces (25, 26) at which the weight (16) contacts the printed circuit board (12), wherein the bearing faces and/or the contact races are in particular disposed so as to be symmetrical in relation to a symmetry axis (108; 110) of the printed circuit board connector.

Embodiment 9

Weight which is specified for assembly in a circuit board arrangement (10) according to any one of Embodiments 1-8.

Embodiment 10

Set of a printed circuit board connector (14) and a weight (16), wherein the printed circuit board connector and the weight in the context of preassembling are specified for being assembled on one another so as to form a composite (11) so as to upon final assembly be assembled on a printed circuit board (12) so as to form a printed circuit board arrangement (10) according to any one of Embodiments 1-9.

Embodiment 11

Assembly method for a set according to Embodiment 10, comprising the following steps:
providing a printed circuit board connector (14) and a weight (16);
fastening the weight (16) to the printed circuit board connector (14), in particular by means of clinching, so as to obtain a composite (11) of a printed circuit board connector and a weight (16).

Embodiment 12

Assembly method for a circuit board arrangement according to any one of Embodiments 1-8, comprising the following steps:
carrying out the method according to Embodiment 11;
assembling the composite (11) on the printed circuit board (12) in such a manner that current path runs from the printed circuit board into the printed circuit board connector (14), wherein the position of the projected center of gravity (106) of the composite lies in such a manner that tilting of the composite (11) while assembling the composite on the printed circuit board (12) is prevented.

LIST OF REFERENCE SIGNS

10 Connector arrangement
11 Composite
12 Printed circuit board
14 Printed circuit board connector
16 Weight
18 Gap
20 Coding means
21 Coding means
22 Bearing face
23 Bearing face
24 Surface
25 Contact face
26 Contact face
27 Major surface
28 Major surface
32 Pin
36 Bore
37 Bore
38 Electric terminals
42 Lateral end
44 Spacing
46 Side wall
47 Side wall
48 Upper wall
49 Rear wall
52 Engagement direction
54 Engagement direction
102 Printed circuit board plane
104 Projected center of gravity
106 Projected center of gravity
108 Symmetry axis
110 Symmetry axis

The invention claimed is:

1. An assembly, comprising:
a circuit board;
an electrical connector mounted to said circuit board; and
a counterweight mounted to said circuit board, wherein said counterweight contacts a first major surface of said circuit board,
a center of gravity of said electrical connector is not situated in a plane that perpendicularly intersects said first major surface and a longitudinal axis of said electrical connector,
a combined center of gravity of said electrical connector and said counterweight is situated in a plane that perpendicularly intersects said first major surface and said longitudinal axis of said electrical connector,
said counterweight arches over an outer circumference of said electrical connector, and
at least 70% of said counterweight by weight is situated exterior of said electrical connector.

2. The assembly of claim 1, wherein:
a second major surface of said electrical connector that adjacently faces said first major surface does not abut said first major surface.

3. The assembly of claim 1, wherein:
said counterweight engages said circuit board and an outer surface said electrical connector such that a force to said electrical connector in at least one of an engagement direction defined by said electrical connector and a disengagement direction defined by said electrical connector is transferred to said circuit board via said counterweight.

4. The assembly of claim 1, wherein:
said counterweight comprises a first side wall, a second side wall, a rear wall, and an upper wall that interconnects said first side wall and said second side wall,
said first side wall, said second side wall and said upper wall collectively form an arch-like structure,
said rear wall interconnects said first side wall, said second side wall and said upper wall, and
said rear wall closes one side of said arch-like structure.

5. The assembly of claim 4, wherein:
an inner surface of said first side wall adjacently faces a first outer side wall of said electrical connector,
an inner surface of said second side wall adjacently faces a second outer side wall of said electrical connector, and
an inner surface of said upper wall adjacently faces an outer upper wall of said electrical connector.

6. The assembly of claim 1, wherein:
said counterweight is electrically conductive and partially encloses a portion of said electrical connector.

7. The assembly of claim 1, wherein:
a rear wall of said counterweight is separated from said electrical connector by a gap.

8. The assembly of claim 1, wherein:
said circuit board comprises a plurality of mounting holes,
said electrical connector comprises a plurality of pins, and
said electrical connector is mounted to said first major surface such that each of said plurality of mounting holes receives a respective one of said plurality of pins.

9. The assembly of claim 1, wherein:
said electrical connector comprises an engagement structure,
said counterweight comprises a counterpart engagement structure,
said engagement structure and said counterpart engagement structure are structured to inhibit a mounting of said counterweight to said circuit board in an arrangement in which said counterweight arches over an outer circumference of said electrical connector unless said engagement structure matingly engages with said counterpart engagement structure.

10. The assembly of claim 1, wherein:
said counterweight comprises at least one pin that extends into an opening in said circuit board.

11. An assembly, comprising:
a circuit board;
an electrical connector mounted to a circuit board; and
a counterweight mounted to said circuit board, wherein said counterweight contacts a major surface of said circuit board,
a portion of said electrical connector is situated intermediate said counterweight and said circuit board,
when said major surface of said circuit board is arranged horizontally, a first straight line through a center of gravity of said electrical connector in a direction of gravity does not intersect said major surface,
when said major surface is arranged horizontally, a second straight line in said direction of gravity through a combined center of gravity of said electrical connector and said counterweight intersects said major surface, and
a percentage of said counterweight by weight is situated exterior of said electrical connector, where said percentage is selected from the group consisting of at least 50%, at least 70% and at least 80%.

12. The assembly of claim 11, wherein:
substantially an entirety of said electrical connector adjacent said major surface is separated from said major surface by a gap.

13. The assembly of claim 11, wherein:
said electrical connector does not contact said major surface except where contact pins of said electrical connector that extend through said circuit board contact said major surface.

14. The assembly of claim 11, wherein:
said counterweight contacts at least an exterior surface of said electrical connector opposite said circuit board, and
when said major surface is arranged horizontally, a weight of said counterweight acts on said electrical connector.

15. The assembly of claim 11, wherein:
said electrical connector is mounted directly to said circuit board; and
said counterweight is mounted directly to said circuit board.

16. The assembly of claim 11, wherein:
said counterweight engages said circuit board and an outer surface said electrical connector such that a force to said electrical connector in at least one of an engagement direction defined by said electrical connector and a disengagement direction defined by said electrical connector is transferred to said circuit board via said counterweight.

17. An assembly, comprising:
a circuit board;
an electrical connector mounted to said circuit board; and
a counterweight mounted to said circuit board, wherein
a portion of said electrical connector is situated intermediate said counterweight and said circuit board,
when a major surface of said circuit board is arranged horizontally, a first straight line through a center of gravity of said electrical connector in a direction of gravity does not intersect said major surface,
when said major surface is arranged horizontally, a second straight line in said direction of gravity through a combined center of gravity of said electrical connector and said counterweight intersects said major surface,
at least 70% of said counterweight by weight is situated exterior of said electrical connector,
said counterweight comprises a pin, and
said circuit board comprises an opening that receives said pin.

18. The assembly of claim 17, wherein:
said counterweight comprises an arching portion that constitutes a substantial portion of said counterweight by weight, and
substantially an entirety of said arching portion forms an arch over an exterior of said electrical connector.

19. The assembly of claim 17, wherein:
said electrical connector comprises an engagement structure,
said counterweight comprises a counterpart engagement structure,
said engagement structure and said counterpart engagement structure are structured to inhibit a mounting of said counterweight to said circuit board in an arrangement in which said counterweight arches over an outer circumference of said electrical connector unless said engagement structure matingly engages with said counterpart engagement structure.

20. The assembly of claim 17, wherein:
said counterweight engages said circuit board and an outer surface said electrical connector such that a force to said electrical connector in at least one of an engagement direction defined by said electrical connector and a disengagement direction defined by said electrical connector is transferred to said circuit board via said counterweight.

* * * * *